United States Patent
Agarwal (10) Patent No.: US 7,446,363 B2
(45) Date of Patent: Nov. 4, 2008

(54) CAPACITOR INCLUDING A PERCENTAGE OF AMORPHOUS DIELECTRIC MATERIAL AND A PERCENTAGE OF CRYSTALLINE DIELECTRIC MATERIAL

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/361,111

(22) Filed: Feb. 24, 2006

(65) Prior Publication Data

US 2006/0180844 A1    Aug. 17, 2006

Related U.S. Application Data

(63) Continuation of application No. 09/512,149, filed on Feb. 23, 2000, now Pat. No. 7,005,695.

(51) Int. Cl.
*H01L 27/108* (2006.01)
*H01L 29/92* (2006.01)

(52) U.S. Cl. .................. 257/296; 257/310; 257/532

(58) Field of Classification Search ......... 257/295–313, 257/532–535; 438/240; 361/313
See application file for complete search history.

(56) References Cited

U.S. PATENT DOCUMENTS

| 3,210,607 | A | 10/1965 | Flanagan |
| 3,691,537 | A | 9/1972 | Burgess et al. |
| 3,755,692 | A | 8/1973 | Mundy |
| 3,886,415 | A | 5/1975 | Genthe |
| 4,333,808 | A | 6/1982 | Bhattacharyya |
| 4,437,139 | A | 3/1984 | Howard |
| 4,464,701 | A | 8/1984 | Roberts et al. |

(Continued)

FOREIGN PATENT DOCUMENTS

JP    1-222469 A    5/1989

(Continued)

OTHER PUBLICATIONS

McIntyre, Paul C. et al., "Kinetics And Mechanisms Of TiN Oxidation Beneath Pt/TiN Films", *J. Appl. Phys.*, vol. 82, No. 9, pp. 4577-4585 (Nov. 1997).

(Continued)

*Primary Examiner*—Marcos D. Pizarro
(74) *Attorney, Agent, or Firm*—Wells St. John, P.S.

(57) ABSTRACT

The invention comprises integrated circuitry and to methods of forming capacitors. In one implementation, integrated circuitry includes a capacitor having a first capacitor electrode, a second capacitor electrode and a high K capacitor dielectric region received therebetween. The high K capacitor dielectric region has a high K substantially amorphous material layer and a high K substantially crystalline material layer. In one implementation, a capacitor forming method includes forming a first capacitor electrode layer over a substrate. A substantially amorphous first high K capacitor dielectric material layer is deposited over the first capacitor electrode layer. The substantially amorphous high K first capacitor dielectric material layer is converted to be substantially crystalline. After the converting, a substantially amorphous second high K capacitor dielectric material layer is deposited over the substantially crystalline first high K capacitor dielectric material layer. A second capacitor electrode layer is formed over the substantially amorphous second high K capacitor dielectric material layer.

24 Claims, 5 Drawing Sheets

U.S. PATENT DOCUMENTS

| | | | |
|---|---|---|---|
| 4,873,610 A | 10/1989 | Shimizu et al. | |
| 4,891,682 A | 1/1990 | Yusa et al. | |
| 4,952,904 A | 8/1990 | Johnson et al. | |
| 5,053,917 A | 10/1991 | Miyasaka et al. | |
| 5,079,191 A | 1/1992 | Shinriki et al. | |
| 5,111,355 A | 5/1992 | Anand | |
| 5,142,438 A | 8/1992 | Reinberg et al. | |
| 5,191,510 A | 3/1993 | Huffman | |
| 5,192,871 A * | 3/1993 | Ramakrishnan et al. | 257/595 |
| 5,225,698 A * | 7/1993 | Kim et al. | 257/303 |
| 5,234,556 A | 8/1993 | Oishi et al. | |
| 5,279,985 A | 1/1994 | Kamiyama | |
| 5,293,510 A | 3/1994 | Takenaka | |
| 5,316,982 A | 5/1994 | Taniguchi | |
| 5,330,935 A | 7/1994 | Dobuzinsky et al. | |
| 5,335,138 A | 8/1994 | Sandhu et al. | |
| 5,348,894 A | 9/1994 | Gnade et al. | |
| 5,352,623 A | 10/1994 | Kamiyama | |
| 5,362,632 A | 11/1994 | Mathews | |
| 5,372,859 A | 12/1994 | Thakoor | |
| 5,390,072 A * | 2/1995 | Anderson et al. | 361/313 |
| 5,397,446 A | 3/1995 | Ishihara et al. | |
| 5,411,912 A | 5/1995 | Sakamoto | |
| 5,438,012 A | 8/1995 | Kamiyama | |
| 5,442,213 A | 8/1995 | Okudaira | |
| 5,442,585 A * | 8/1995 | Eguchi et al. | 365/149 |
| 5,452,178 A | 9/1995 | Emesh et al. | |
| 5,466,629 A | 11/1995 | Mihara et al. | |
| 5,468,687 A | 11/1995 | Carl et al. | |
| 5,471,364 A | 11/1995 | Summerfelt et al. | |
| 5,504,041 A | 4/1996 | Summerfelt | |
| 5,508,221 A | 4/1996 | Kamiyama | |
| 5,508,953 A | 4/1996 | Fukuda et al. | |
| 5,510,651 A | 4/1996 | Maniar et al. | |
| 5,552,337 A | 9/1996 | Kwon et al. | |
| 5,555,486 A | 9/1996 | Kingon et al. | |
| 5,557,122 A * | 9/1996 | Shrivastava et al. | 257/309 |
| 5,561,307 A * | 10/1996 | Mihara et al. | 257/295 |
| 5,580,812 A | 12/1996 | Ikemasu | |
| 5,585,300 A | 12/1996 | Summerfelt | |
| 5,617,290 A | 4/1997 | Kulwicki et al. | |
| 5,641,702 A | 6/1997 | Imai et al. | |
| 5,654,222 A | 8/1997 | Sandhu et al. | |
| 5,661,319 A | 8/1997 | Fujii et al. | |
| 5,663,088 A | 9/1997 | Sandhu et al. | |
| 5,665,210 A | 9/1997 | Yamazaki | |
| 5,668,040 A | 9/1997 | Byun | |
| 5,675,028 A | 10/1997 | Neumayer et al. | |
| 5,688,724 A | 11/1997 | Yoon et al. | |
| 5,723,382 A | 3/1998 | Sandhu et al. | |
| 5,728,603 A | 3/1998 | Emesh | |
| 5,741,626 A | 4/1998 | Jain et al. | |
| 5,753,547 A | 5/1998 | Ying | |
| 5,760,474 A | 6/1998 | Schuele | |
| 5,780,115 A | 7/1998 | Park et al. | |
| 5,780,359 A | 7/1998 | Brown et al. | |
| 5,783,253 A | 7/1998 | Roh | |
| 5,786,248 A | 7/1998 | Schuegraf | |
| 5,790,366 A | 8/1998 | Desu et al. | |
| 5,798,903 A | 8/1998 | Dhote et al. | |
| 5,807,774 A | 9/1998 | Desu et al. | |
| 5,814,852 A | 9/1998 | Sandhu et al. | |
| 5,834,060 A | 11/1998 | Kawahara et al. | |
| 5,834,345 A | 11/1998 | Shimizu | |
| 5,837,591 A | 11/1998 | Shimada | |
| 5,837,593 A | 11/1998 | Park et al. | |
| 5,838,035 A | 11/1998 | Ramesh | |
| 5,843,830 A | 12/1998 | Graettinger et al. | |
| 5,844,771 A | 12/1998 | Graettinger et al. | |
| 5,858,873 A | 1/1999 | Vitkavage et al. | |
| 5,864,496 A | 1/1999 | Mueller et al. | |
| 5,872,696 A | 2/1999 | Peters et al. | |
| 5,876,788 A | 3/1999 | Bronner et al. | |
| 5,888,295 A | 3/1999 | Sandhu et al. | |
| 5,899,740 A | 5/1999 | Kwon | |
| 5,910,218 A | 6/1999 | Park et al. | |
| 5,910,880 A | 6/1999 | Deboer et al. | |
| 5,913,125 A | 6/1999 | Brouillette et al. | |
| 5,916,634 A | 6/1999 | Fleming et al. | |
| 5,919,531 A | 7/1999 | Arkles et al. | |
| 5,920,775 A | 7/1999 | Koh | |
| 5,930,106 A | 7/1999 | Deboer et al. | |
| 5,930,584 A | 7/1999 | Sun et al. | |
| 5,933,316 A | 8/1999 | Ramakrishnan | |
| 5,943,580 A * | 8/1999 | Ramakrishnan | 438/381 |
| 5,955,758 A | 9/1999 | Sandhu et al. | |
| 5,970,369 A | 10/1999 | Hara et al. | |
| 5,973,911 A | 10/1999 | Nishioka | |
| 5,985,714 A | 11/1999 | Sandhu et al. | |
| 5,990,507 A | 11/1999 | Mochizuki et al. | |
| 5,998,247 A * | 12/1999 | Wu | 438/200 |
| 6,010,744 A | 1/2000 | Buskirk et al. | |
| 6,010,931 A | 1/2000 | Sun et al. | |
| 6,015,989 A | 1/2000 | Horikawa et al. | |
| 6,017,789 A | 1/2000 | Sandhu et al. | |
| 6,027,969 A | 2/2000 | Huang et al. | |
| 6,028,359 A | 2/2000 | Merchant et al. | |
| 6,028,360 A | 2/2000 | Nakamura et al. | |
| 6,037,205 A | 3/2000 | Huh et al. | |
| 6,046,469 A | 4/2000 | Yamazaki et al. | |
| 6,048,764 A | 4/2000 | Suzuki et al. | |
| 6,051,859 A | 4/2000 | Hosotani et al. | |
| 6,054,730 A | 4/2000 | Noguchi et al. | |
| 6,071,771 A | 6/2000 | Schuegraf | |
| 6,081,034 A | 6/2000 | Sandhu et al. | |
| 6,090,659 A | 7/2000 | Laibowitz et al. | |
| 6,093,966 A | 7/2000 | Venkatraman et al. | |
| 6,096,597 A | 8/2000 | Tsu et al. | |
| 6,100,137 A | 8/2000 | Chen et al. | |
| 6,143,597 A | 11/2000 | Matsuda et al. | |
| 6,146,959 A | 11/2000 | Deboer | |
| 6,150,208 A | 11/2000 | Deboer et al. | |
| 6,150,706 A | 11/2000 | Thakur et al. | |
| 6,156,638 A | 12/2000 | Agarwal | |
| 6,162,744 A | 12/2000 | Al-Shareef et al. | |
| 6,165,833 A | 12/2000 | Parekh | |
| 6,165,834 A | 12/2000 | Agarwal et al. | |
| 6,168,985 B1 | 1/2001 | Asano et al. | |
| 6,171,925 B1 | 1/2001 | Graettinger | |
| 6,180,481 B1 | 1/2001 | Deboer et al. | |
| 6,191,443 B1 | 2/2001 | Al-Shareef et al. | |
| 6,197,653 B1 | 3/2001 | Khamankar et al. | |
| 6,198,124 B1 | 3/2001 | Sandhu et al. | |
| 6,201,728 B1 | 3/2001 | Narui et al. | |
| 6,204,203 B1 | 3/2001 | Narwankar et al. | |
| 6,235,594 B1 | 5/2001 | Merchant et al. | |
| 6,255,186 B1 | 7/2001 | Al-Shareef et al. | |
| 6,274,443 B1 | 8/2001 | Yu et al. | |
| 6,275,370 B2 | 8/2001 | Gnade | |
| 6,282,080 B1 | 8/2001 | DeBoer et al. | |
| 6,376,332 B1 | 4/2002 | Yanagita et al. | |
| 6,727,143 B1 | 4/2004 | Hui et al. | |
| 6,730,559 B2 | 5/2004 | Agarwal et al. | |
| 7,005,695 B1 | 2/2006 | Agarwal | |

FOREIGN PATENT DOCUMENTS

| | | |
|---|---|---|
| JP | 403209869 A | 9/1991 |
| JP | 04162527 A | 6/1992 |
| JP | 05-221644 | 8/1993 |
| JP | 405211288 A | 8/1993 |
| JP | 5-243524 | 9/1993 |
| JP | 405343641 | 12/1993 |
| JP | 06-021333 | 1/1994 |

| | | |
|---|---|---|
| JP | 6061449 | 3/1994 |
| JP | 407161827 A | 6/1995 |
| WO | WO 97/44797 | 11/1997 |

OTHER PUBLICATIONS

Onishi, Shigeo et al., "A Half-Micron Ferroelectric memory Cell Technology With Stacked Capacitor Structure",*I.E.E.E.*, IDEM 94-843, pp. 843-846 (1994).

Fazan, P.C., et al., "A High-C Capacitor (20.4fF/$\mu m^2$) with Ultrathin CVD-$Ta_2O_5$ Films Deposited on Rugged Poly-Si for Hig Density DRAMs", 1992 IEEE, pp. 263-266.

Lesaicherre, P-Y, et. al., "A Gbit-Scale DRAM Stacked Capacitor Technology with ECR MOCVD $SrTiO_3$ and RIE Patterned $RuO_2$/TiN Storage Nodes", 1994 IEEE, pp. 831-834.

Yamaguchi, H., et. al., "Structural and Electrical Characterization of $SrTiO_3$ Thin Films Prepared by Metal Organic Chemical Vapor Deposition", Jpn. J. Appl. Phys. vol. 32 (1993), Pt. 1, No. 9B, pp. 4069-4073.

Kamiyama, S., et. al., "Highly Reliable 2.5nm $Ta_2O_5$ Capacitor Process Technology for 256Mbit DRAMs", 1991 IEEE, pp. 827-830.

Kamiyama, S., et. al., "Ultrathin Tantalum Oxide Capacitor Dielectric Layers Fabricated Using Rapid Thermal Nitridation prior to Low Pressure Chemical Vapor Deposition", J. Electrochem. Soc., vol. 140, No. 6, Jun. 1993, pp. 1617-1625.

Eimori, T., et. al., "A Newly Designed Planar Stacked Capacitor Cell with High dielectric Constant Film for 256Mbit DRAM", 1993 IEEE, pp. 631-634.

Hiroshi Shinriki et al., "UV-$O_3$ and Dry-$O_2$: Two-Step Annealed Chemical Vapor-Deposited $Ta_2O_5$ Films for Storage Dielectrics of 64-Mb DRAM's", IEEE, vol. 38 No. 3, Mar. 1991.

S. Wolf et al. "Semiconductor Memory Process Integration", *Silicon Processing for the VLSI Era*, vol. 2, Lattice Press, 1990; pp. 589-591.

M.A. Farooq, S.P. Murarka, C.C. Chang, F.A. Baiocchi, Tantalum nitride as a dissusion barrier between $Pd_2Si$, CoSi2 and aluminum, *1989 American Institute of Physics*, pp. 3017-3022.

Anonymous Research Disclosure, 1989RD-0299041 titled "Double High Dielectric Capacitor", Derewent-Week 198917 (Derwent World Patent Index); Mar. 10, 1989.

Chang et al.; "Structures of tantalum pentoxide thin films formed by reactive sputtering of Ta metal",Elseview Science S.A. 1995, Thin Solid Films pp. 56-63.

Van Zant, "Microchip Fabrication: A Practical Guide to Semiconductor Processing" 4th Edition, McGraw Hill 2000, pp. 388-389.

Ghandhi, Sorab K., "VLSI Fabrication Principles—Silicon and Gallium Arsenide," © 1994 by John Wiley & Sons, Inc., pp. 522-523 (4 total pages).

Jaeger, Richard C., "Volume V—Introduction to Microelectronic Fabrication," © 1988 by Addison-Wesley Publishing Company, Inc., p. 116 (3 total pages).

Wolf et al., "Silicon Processing for the VLSI Era—vol. 1: Process Technology," © 1986 by Lattice Press, pp. 335, 336, 348-353 (10 total pages).

IBM Technical Disclosure Bulletin: "Process for Selective Etching of Tantalum Oxide", vol. 27, No. 12, May 1985, one page.

U.S. Appl. No. 09/083,257, filed May 21, 1998, Al-Shareef et al.

U.S. Appl. No. 09/512,149, filed Feb. 20, 2000, Agarwal.

\* cited by examiner

CAPACITOR INCLUDING A PERCENTAGE OF AMORPHOUS DIELECTRIC MATERIAL AND A PERCENTAGE OF CRYSTALLINE DIELECTRIC MATERIAL

CROSS REFERENCE TO RELATED APPLICATION

This patent is a continuation application of U.S. patent application Ser. No. 09/512,149, filed Feb. 23, 2000, now U.S. Pat. No. 7,005,695, issued Feb. 28, 2006, entitled "Integrated Circuitry a Capacitor With an Amorphous and a Crystalline High K Capacitor Dielectric Region", naming Vishnu K. Agarwal as inventor, the teachings of which are incorporated by reference.

TECHNICAL FIELD

This invention relates to integrated circuitry and to methods of forming capacitors.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices, such as 256 Mbit DRAMs and beyond, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high K" materials due to their high dielectric constants, which make them attractive as dielectric materials in capacitors, for example for high density DRAMs and non-volatile memories. In the context of this document, "high K" means a material having a dielectric constant of at least 10. Such materials include tantalum pentoxide, barium strontium titanate, strontium titanate, barium titanate, lead zirconium titanate and strontium bismuth titanate. Using such materials might enable the creation of much smaller and simpler capacitor structures for a given stored charge requirement, enabling the packing density dictated by future circuit design.

Despite the advantages of high dielectric constants and low leakage, insulating inorganic metal oxide materials suffer from many drawbacks. For example, all of these materials incorporate oxygen or are otherwise exposed to oxygen for densification to produce the desired capacitor dielectric layer. Densification or other exposure to an oxygen containing environment is utilized to fill oxygen vacancies which develop in the material during its formation. For example when depositing barium strontium titanate, the material as-deposited can have missing oxygen atoms that may deform its crystalline structure and yield poor dielectric properties. To overcome this drawback, for example, the material is typically subjected to a high temperature anneal in the presence of an oxygen ambient. The anneal drives any carbon present out of the layer and advantageously injects additional oxygen into the layer such that the layer uniformly approaches a stoichiometry of five oxygen atoms for every two tantalum atoms. The oxygen anneal is commonly conducted at a temperature of from about 400° C. to about 1000° C. utilizing one or more of $O_3$, $N_2O$ and $O_2$. The oxygen containing gas is typically flowed through a reactor at a rate of from about 0.5 slm to about 10 slm.

Certain high K dielectric materials have better current leakage characteristics in capacitors than other high K dielectric materials. In some materials, aspects of a high K material which might be modified or tailored to achieve a highest capacitor dielectric constant possible but will unfortunately also tend to hurt the leakage characteristics (i.e., increase current leakage). One method of decreasing leakage while maximizing capacitance is to increase the thickness of the dielectric region in the capacitor. Unfortunately, this is not always desirable.

SUMMARY

The invention comprises integrated circuitry and methods of forming capacitors. In one implementation, integrated circuitry includes a capacitor having a first capacitor electrode, a second capacitor electrode and a high K capacitor dielectric region received therebetween. The high K capacitor dielectric region has a high K substantially amorphous material layer and a high K substantially crystalline material layer. In one implementation, a capacitor forming method includes forming a first capacitor electrode layer over a substrate. A substantially amorphous first high K capacitor dielectric material layer is deposited over the first capacitor electrode layer. The substantially amorphous high K first capacitor dielectric material layer is converted to be substantially crystalline. After the converting, a substantially amorphous second high K capacitor dielectric material layer is deposited over the substantially crystalline first high K capacitor dielectric material layer. A second capacitor electrode layer is formed over the substantially amorphous second high K capacitor dielectric material layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It is recognized that high K crystalline dielectric materials tend to have higher dielectric constant than high K amorphous dielectric materials. For example, amorphous $Ta_2O_5$ dielectric constants range from 15 to 20, while the dielectric constants of crystalline $Ta_2O_5$ can range from 35 to 45. Yet, leakage characteristics of crystalline $Ta_2O_5$ are much worse than amorphous $Ta_2O_5$, and thus could potentially limit the use of crystalline $Ta_2O_5$. However, it would be desirable to take advantage of higher dielectric constants of, for example, crystalline $Ta_2O_5$ as capacitor area continues to shrink.

Figure 1:
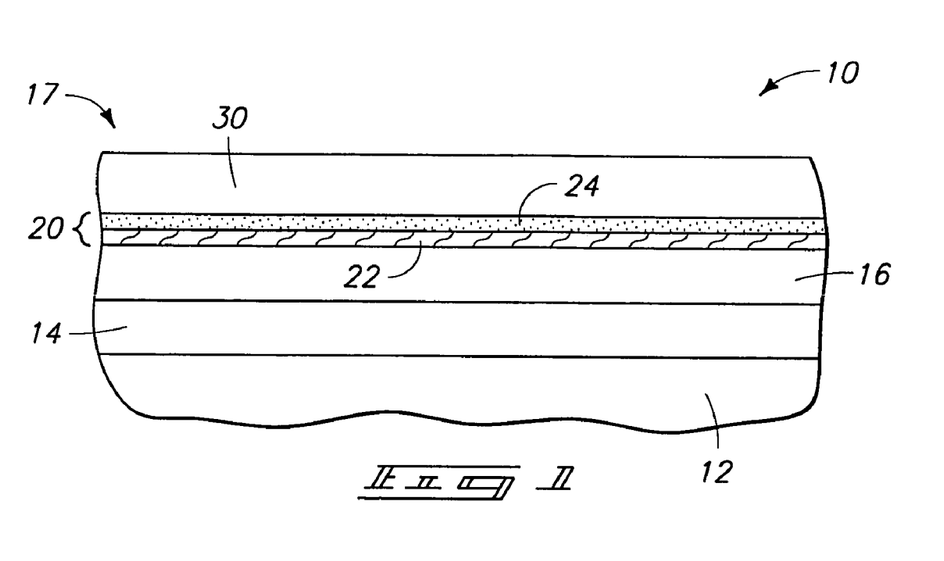
FIG. 1 is a view of a semiconductor wafer fragment comprising integrated circuitry in accordance with an aspect of the invention.

A first embodiment example integrated circuitry in accordance with but one aspect of the invention is depicted in FIG. 1. Such comprises a semiconductor wafer fragment 10 comprising a semiconductor substrate 12 and overlying insulative layer 14, such as silicon dioxide. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate region 12 in this example preferably comprises bulk monocrystalline silicon, although other materials and semiconductor-on-insulator constructions are, of course, contemplated. Discussion proceeds with description of a capacitor construction 17 fabricated over substrate 12/14.

A first capacitor electrode layer 16 is formed over substrate 12/14. Such could comprise any suitable conductive material, with inherently conductive metals such as elemental metals and metal alloys, and conductive metal oxides, and mixtures thereof being preferred. An exemplary thickness range for electrode layer 16 is from about 100 Angstroms to about 1000 Angstroms.

A high K capacitor dielectric region 20 is formed over first capacitor electrode layer 16. A second capacitor electrode layer 30, preferably the same as the first, is formed over high K capacitor dielectric region 20, such that high K capacitor dielectric region 20 is received between electrode layers 16 and 30. High K capacitor dielectric region 20 comprises a high K substantially crystalline material layer 22 and a high K substantially amorphous material layer 24. In the context of this document, "substantially crystalline" means greater than or equal to about 70% crystallinity, whereas "substantially amorphous" means that the subject material layer is greater than or equal to about 70% amorphous phase. More preferably the substantially crystalline and substantially amorphous materials have greater than 90%, and more preferably greater than 98% of their respective phase. A preferred thickness range for layers 22 and 24 is from about 20 Angstroms to about 250 Angstroms each. A preferred thickness range for capacitor dielectric region 20 is from about 40 Angstroms to about 500 Angstroms, with such region preferably being the only capacitor dielectric region which is received between first capacitor electrode 16 and second capacitor electrode 30. Accordingly preferably, high K capacitor dielectric region 20 consists essentially of high K substantially amorphous material layer 24 and high K substantially crystalline material layer 22.

The high K substantially amorphous material and the high K substantially crystalline material may constitute the same chemical composition, or different chemical compositions. For example, and by way of example only, layer 22 might comprise or consist essentially of barium strontium titanate, while layer 24 might comprise or consist essentially of $Ta_2O_5$. Most preferably, layers 22 and 24 comprise the same chemical composition, with a preferred material being $Ta_2O_5$, but for a phase difference in the material as described above and subsequently below. Other dielectric materials might also, of course, be received within capacitor dielectric region 20, but such is not most preferred. Further, more than the illustrated two amorphous and crystalline layers might be received there.

Further preferably, at least one of the high K substantially amorphous material layer and the high K substantially crystalline material layer contacts at least one of the first capacitor electrode and second capacitor electrode. Further preferably, the high K substantially amorphous material layer contacts at least one of the first capacitor electrode and the second capacitor electrode. Further preferably, the high K capacitor substantially amorphous material layer contacts only one of the first capacitor electrode and the second capacitor electrode. As shown, the high K substantially amorphous material layer contacts one of the first and second capacitor electrodes (electrode 30 as shown), and the high K substantially crystalline material layer contacts the other of the first and second capacitor electrodes (electrode 16 as shown). Thus in the FIG. 1 depicted embodiment, capacitor 17 is received at least partially over semiconductor substrate 12, with the high K substantially crystalline material layer 22 being received between semiconductor substrate 12 and high K substantially amorphous material layer 24.

Figure 2:
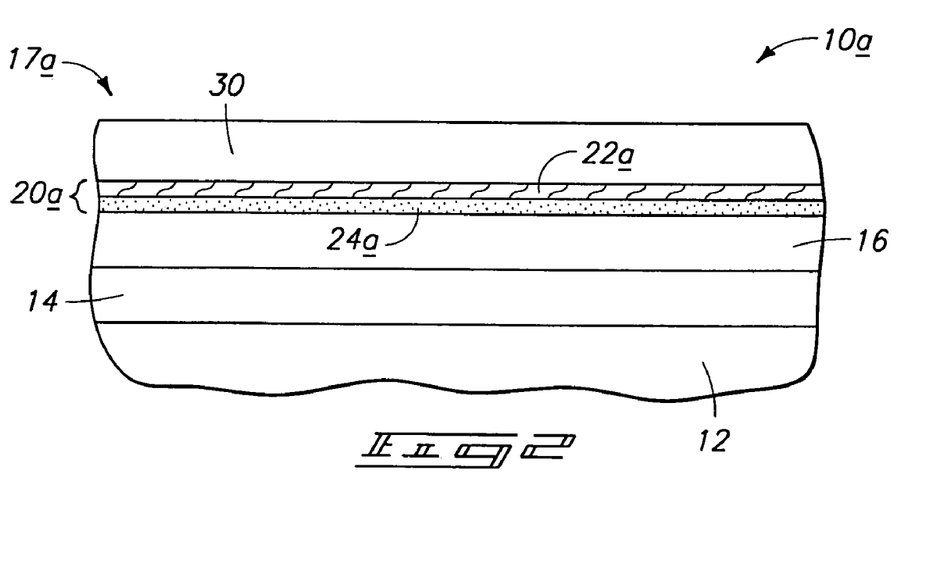
FIG. 2 is a view of an alternate embodiment semiconductor wafer fragment comprising integrated circuitry in accordance with an aspect of the invention.

FIG. 2 depicts an alternate embodiment wherein the positionings of layer 22 and 24 have been reversed. Like numerals from the first described embodiment are utilized where appropriate, with differences being indicated with the suffix "a".

Figure 3:
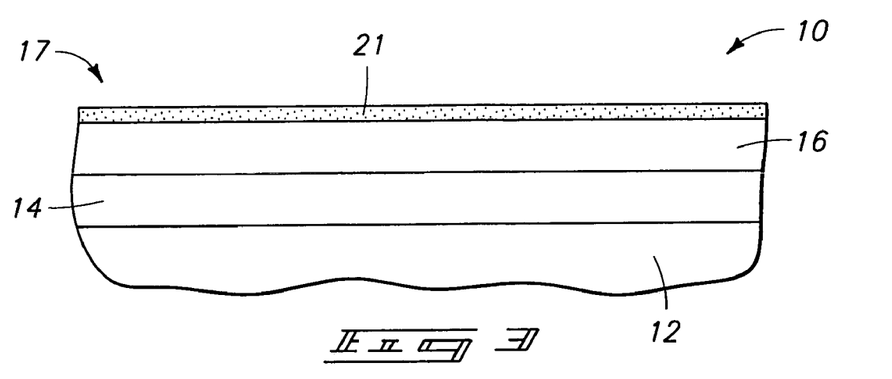
FIG. 3 is a view of a semiconductor wafer fragment in process in accordance with an aspect of the invention.
Figure 6:
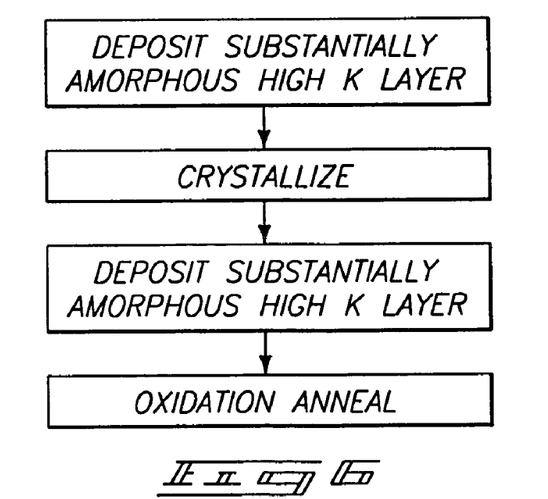
FIG. 6 is a diagrammatic depiction of one preferred processing flow in accordance with an aspect of the invention.

The subject capacitors might be fabricated in any of a number of ways. Some example embodiments are described with reference to FIGS. 3-8, and with reference to the FIG. 1 preferred embodiment. Like numerals from the first described embodiment are utilized where appropriate, with differences being depicted with different numerals. Referring initially to FIGS. 3 and 6, a substantially amorphous first high K capacitor dielectric material layer 21 is formed over first capacitor electrode layer 16, and preferably to contact electrode layer 16 as shown. Such is preferably deposited to the same thickness as layer 22 in the FIG. 1 embodiment. $Ta_2O_5$ is the preferred material, although other substantially amorphous high K materials are of course contemplated. Any existing or yet-to-be-developed technique for forming such amorphous layer can be utilized, with no one in particular being preferred.

Figure 4:
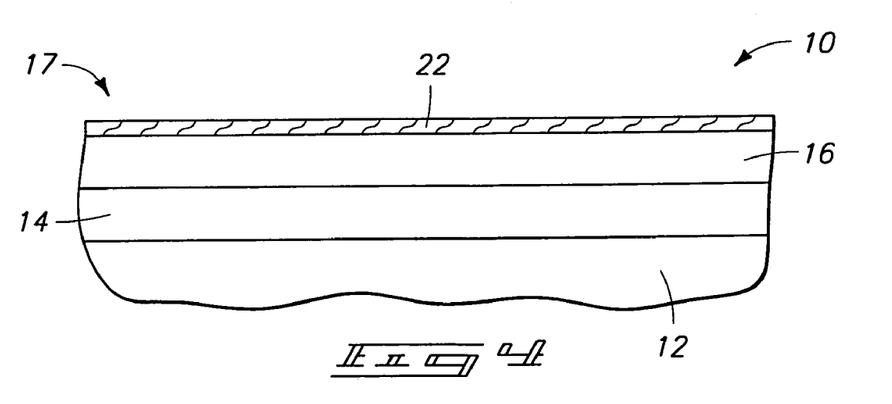
FIG. 4 is a view of the FIG. 3 wafer fragment at a processing step subsequent to that depicted by FIG. 3.

Referring to FIGS. 4 and 6, substantially amorphous high K first capacitor dielectric material layer 21 (not shown) is converted to be substantially crystalline, as depicted with numeral 22. A preferred technique for doing so comprises an anneal in an inert atmosphere, such as $N_2$ or Ar, at a temperature from about 650° C. to about 950° C. at from about 5 Torr to about 1 atmosphere from about one minute to about one hour. Accordingly preferably, the converting occurs in an atmosphere which is substantially void of oxygen.

Figure 5:
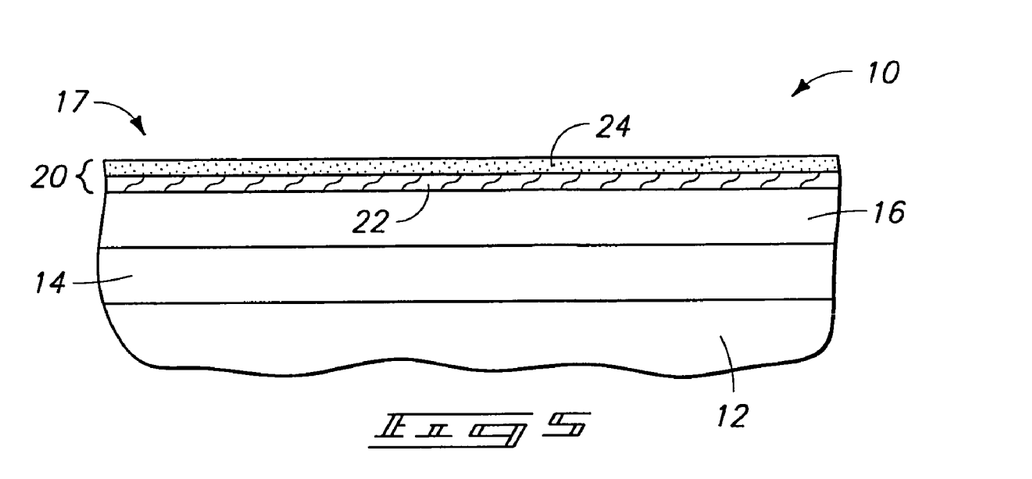
FIG. 5 is a view of the FIG. 3 wafer fragment at a processing step subsequent to that depicted by FIG. 4.

Referring to FIGS. 5 and 6, and after the converting, substantially amorphous second high K capacitor dielectric material layer 24 is formed over substantially crystalline first high K capacitor dielectric material layer 22. Preferably and as shown, layer 24 is formed to physically contact layer 22.

Then preferably, second high K capacitor dielectric material layer 24 is oxidize annealed in an oxygen containing atmosphere at a temperature of no greater than about 600° C., and more preferably from about 300° C. to about 550° C., and effective to maintain second high K capacitor dielectric material layer 24 substantially amorphous. Preferred annealing gases include, by way of example only, $N_2O$, $O_2$, $O_3$, and mixtures thereof. Preferred pressure range is from 150 mTorr to 1 atmosphere, and at a time period preferably ranging from about 10 seconds to about 1 hour. Such oxidize annealing preferably densities and inserts oxygen in layer 24, and also into crystalline layer 22.

Referring to FIG. 1, second capacitor electrode layer 30 is formed over substantially amorphous second high K capacitor dielectric material layer 24, and preferably in physical contact therewith.

Figure 7:
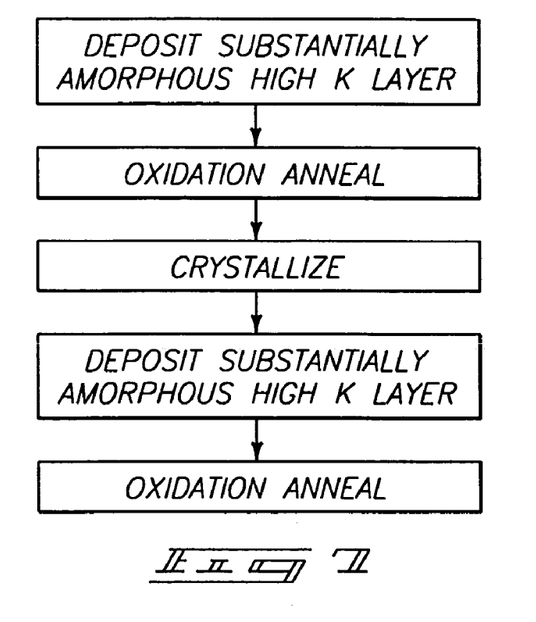
FIG. 7 is a diagrammatic depiction of another preferred processing flow in accordance with an aspect of the invention.
Figure 8:
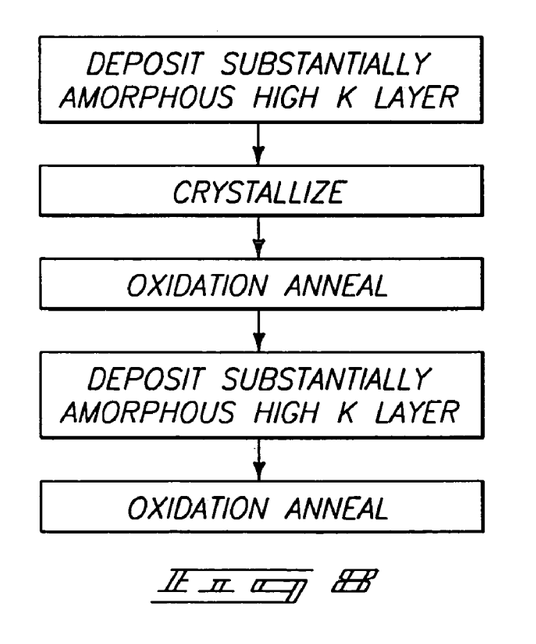
FIG. 8 is a diagrammatic depiction of still another preferred processing flow in accordance with an aspect of the invention.

Any of a myriad of alternate processing sequences might be performed, with two such sequences being depicted in FIGS. 7 and 8. FIG. 7 depicts conducting an oxidize annealing, preferably as described above, intermediate the first deposition of a substantially amorphous high K capacitor dielectric material layer and subsequent crystallization thereof. FIG. 8 depicts exemplary alternate processing whereby an oxidization anneal is conducted intermediate crystallization of the first substantially amorphous deposited high K capacitor dielectric layer and the deposit of the second substantially amorphous substantially high K dielectric layer.

Figure 9:
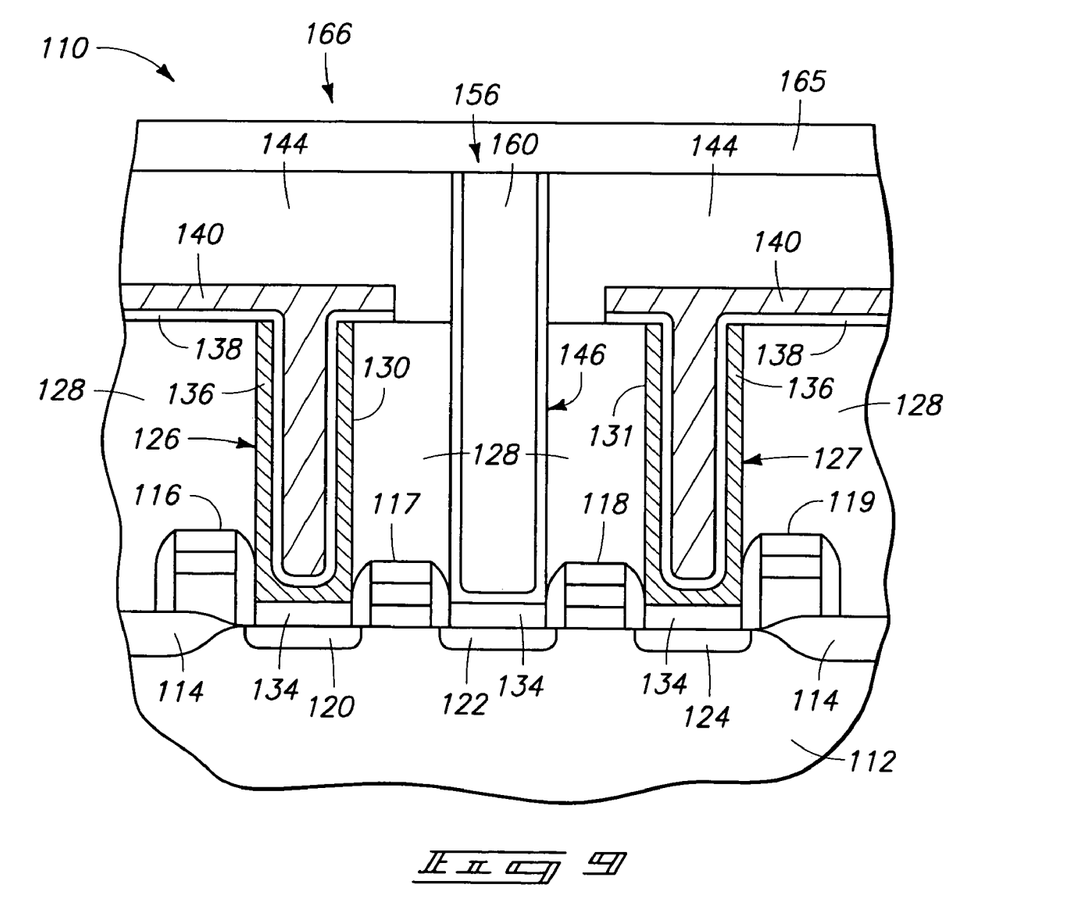
FIG. 9 is a diagrammatic depiction of example integrated circuitry in accordance with an aspect of the invention.

Such integrated circuitry construction and fabrication methods might be used in a number of different applications, by way of example only in the fabrication of logic or memory circuitry, such as DRAM circuitry fabrication. FIG. 9 illustrates DRAM circuitry and fabrication thereof. A wafer fragment 110 comprises a bulk monocrystalline silicon substrate 112 having a pair of field isolation regions 114. A series of four DRAM word line constructions 116, 117, 118 and 119 are formed over the illustrated substrate, and comprise gates of respective DRAM cell field effect transistors. Gate constructions 116, 117, 118 and 119 are conventional as shown, and comprise a gate dielectric layer (not shown), an overlying conductive polysilicon region, an overlying higher conductive elemental metal or silicide region, and an insulative cap and sidewall spacers, and which are not otherwise specifically identified with numerals. In the illustrated section, word line 117 comprises a transistor access gate having associated source/drain diffusion regions 120 and 122 formed within monocrystalline silicon substrate 12. Similarly, DRAM word line 118 comprises a gate of a DRAM cell field effect transistor having an associated pair of source/drain diffusion regions 122 and 124. Such depicts two DRAM cells which share a source/drain region 122 which will electrically connect with a bit line, as described subsequently. The other respective source/drain diffusion regions 120 and 124 are formed in electrical connection with DRAM cell capacitor constructions 126 and 127, respectively. The illustrated example is in the fabrication of bit line-over-capacitor DRAM integrated circuitry construction, although other DRAM integrated circuitry and other integrated circuitry constructions and fabrication methods are contemplated.

Conductive covering regions 134 are formed over source/drain regions 120, 122 and 124. Such might be formed to have outermost surfaces or tops which are received elevationally below the outermost top surfaces of gate constructions 116-119 as shown, or received elevationally thereabove (not shown). Such might comprise conductive polysilicon, metals, and/or metal compounds, including conductive barrier layer materials.

An insulating layer 128, for example borophosphosilicate glass (BPSG), is formed over the word lines and is planarized as shown. An antireflective coating layer or layers (not shown) might preferably comprise an outermost portion of layer 128, and comprise silicon oxynitride which can also function as a diffusion barrier to hydrogen and other gases. Capacitor container openings 130 and 131 are formed within insulative layer 128 over source/drain diffusion regions 120 and 124, respectively, and the associated conductive covering regions 134. A capacitor storage node layer 136 is formed within container openings 130 and 131 in electrical connection with source/drain diffusion regions 120 and 124 through conductive covering/plugging material 134. Such can be planarized back to be isolated within the container openings as shown. Example materials include conductively doped polysilicon, metal and metal compounds, with conductive metal oxides being preferred materials. Example conductive metal oxides include ruthenium oxide, iridium oxide, and rhodium oxide.

A capacitor dielectric layer 138 is formed over storage node electrode layer 136. Layer 138 preferably is fabricated to comprise any of the above capacitor dielectric regions 20, 20a or others as described above. A DRAM capacitor cell electrode layer 140 is formed over capacitor dielectric layer 138. Cell electrode layer 140 is preferably common to multiple capacitors of the DRAM circuitry, and preferably comprises a conductive metal oxide. Layer 140 is patterned as desired and shown to provide an opening therethrough to ultimately achieve bit line electrical connection with shared diffusion region 122 (shown and described below), and to otherwise form a desired circuitry pattern thereof outwardly of the fragment depiction of FIG. 9.

An insulative layer 144 is formed over DRAM capacitor cell electrode layer 140. An example and preferred material is BPSG. A contact opening 146 is formed through insulative layers 144 and 128 for ultimate formation of a conductive bit contact 156. Conductive material 160 is formed within the contact opening in electrical connection with DRAM capacitor cell electrode layer 140 (not shown) and within contact opening 146 in electrical connection with bit contact source/drain diffusion region 122. Conductive material 160 preferably comprises a metal and/or metal compound which is/are capable of oxidizing to a non-conductive metal oxide upon effective exposure to the conductive metal oxide of layer 140. Preferred materials include titanium, titanium nitride, and tungsten, by way of example only. Such layers are deposited and planarized back relative to insulative layer 144 as shown.

A conductive layer 165 is deposited over and in electrical connection with conductive material 160. Such is patterned to form a DRAM bit line 166 over insulative layer 144 and in electrical connection with source/drain diffusion region 122 through conductive material 160. Other devices might be formed outwardly of layer 165, followed ultimately by formation of a final passivation layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. Integrated circuitry comprising:
   a first electrode;
   a second electrode;
   a dielectric region between the first and second electrodes, the dielectric region comprising a first electrically insulative layer and a second electrically insulative layer, the first electrically insulative layer comprising a percentage of crystalline material and the second electrically insulative layer comprising a percentage of amorphous material, at least one of the percentages comprising about 70% to about 98%; and
   wherein the percentage of the crystalline material is different from the percentage of the amorphous material.

2. The integrated circuitry of claim 1 wherein the at least one of the percentages is less than or equal to about 95%.

3. The integrated circuitry of claim 1 wherein the at least one of the percentages is less than or equal to about 90%.

4. The integrated circuitry of claim 1 wherein the at least one of the percentages is less than or equal to about 85%.

5. The integrated circuitry of claim 1 wherein both of the percentages are about 98%.

6. The integrated circuitry of claim 1 wherein the at least one of the percentages comprises the percentage for the crystalline material.

7. The integrated circuitry of claim 1 wherein the at least one of the percentages comprises the percentage for the amorphous material.

8. Integrated circuitry comprising:
   a first conductive layer;
   a first dielectric layer over the first conductive layer, the first dielectric layer comprising a percentage of amorphous material;
   a second dielectric layer over the first conductive layer, the second dielectric layer comprising a percentage of crystalline material, the percentage of crystalline material being different from the percentage of amorphous material; and
   a second conductive layer over the first and second dielectric layers.

9. The integrated circuitry of claim 8 wherein the first dielectric layer and the second dielectric layer comprise different chemical compositions.

10. The integrated circuitry of claim 8 wherein the percentage of crystalline material comprises about 70% to about 95%.

11. The integrated circuitry of claim 8 wherein the percentage of amorphous material comprises about 70% to about 95%.

12. Integrated circuitry comprising:
    a substrate;
    a transistor over the substrate, the transistor comprising a source region and a drain region;
    a capacitor over the substrate and electrically coupled to one of the source and drain regions, the capacitor comprising:
       a first electrode layer;
       a second electrode layer; and
       a dielectric layer comprising amorphous material and crystalline material intermediate the first and second electrode layers, the dielectric layer comprising a thickness of from about 40 Angstroms to about 500 Angstroms; and
    wherein the amorphous material comprises a percentage of amorphous material, and wherein the crystalline material comprises a percentage of crystalline material, and wherein the percentage of the crystalline material is different from the percentage of the amorphous material.

13. The integrated circuitry of claim 12 wherein the percentage of the amorphous material comprises a range of about 70% to about 98%.

14. The integrated circuitry of claim 12 wherein the transistor and the capacitor are components of DRAM circuitry.

15. The integrated circuitry of claim 12 wherein the percentage of the amorphous material comprises a range of about 70% to about 95%.

16. The integrated circuitry of claim 12 wherein the percentage of the crystalline material comprises a range of about 70% to about 98%.

17. The integrated circuitry of claim 12 wherein the transistor and the capacitor are components of logic circuitry.

18. The integrated circuitry of claim 12 wherein the transistor and the capacitor are components of memory circuitry.

19. Integrated circuitry comprising:
    a first electrode;
    a second electrode;
    a dielectric region between the first and second electrodes, the dielectric region comprising a crystalline portion over an amorphous portion, and wherein one of the amorphous portion and the crystalline portion is less than entirely amorphous or crystalline, respectively; and
    wherein the amorphous portion comprises a percentage of amorphous material, and wherein the crystalline portion comprises a percentage of crystalline material, and wherein the percentage of the crystalline material is different from the percentage of the amorphous material.

20. The integrated circuitry of claim 19 wherein the amorphous portion is less than entirely amorphous.

21. The integrated circuitry of claim 19 wherein the crystalline portion is less than entirely crystalline.

22. The integrated circuitry of claim 19 wherein the crystalline portion is about 70% to about 98% crystalline.

23. The integrated circuitry of claim 19 wherein the dielectric region comprises a thickness in a range from about 40 Angstroms to about 500 Angstroms.

24. The integrated circuitry of claim 19 wherein the first electrode comprises metal.

* * * * *